US012660329B2

(12) United States Patent (10) Patent No.: US 12,660,329 B2
Dia et al. (45) Date of Patent: Jun. 16, 2026

(54) SEMICONDUCTOR STRUCTURE OF HYBRID CELL ARRAY

(71) Applicant: MEDIATEK INC., Hsinchu City (TW)

(72) Inventors: Kin-Hooi Dia, Hsinchu City (TW);
Ho-Chieh Hsieh, Hsinchu City (TW);
Hsing-I Tsai, Hsinchu City (TW)

(73) Assignee: MEDIATEK INC., Hsinchu City (TW)

( * ) Notice: Subject to any disclaimer, the term of this
patent is extended or adjusted under 35
U.S.C. 154(b) by 587 days.

(21) Appl. No.: 18/051,026

(22) Filed: Oct. 31, 2022

(65) Prior Publication Data

US 2023/0178537 A1 Jun. 8, 2023

Related U.S. Application Data

(60) Provisional application No. 63/286,583, filed on Dec.
7, 2021.

(51) Int. Cl.
H10D 89/10 (2025.01)
H10D 84/85 (2025.01)
*H03K 19/00* (2006.01)
*H03K 19/017* (2006.01)
(Continued)

(52) U.S. Cl.
CPC ............. H10D 89/10 (2025.01); H10D 84/85
(2025.01); *H03K 19/0013* (2013.01); *H03K*
*19/017* (2013.01); *H10W 10/014* (2026.01);
*H10W 10/17* (2026.01)

(58) Field of Classification Search
CPC ...... H10D 89/10; H10D 84/85; H10D 84/907;
H01L 21/76224; H03K 19/0013; H03K
19/017
See application file for complete search history.

(56) References Cited

U.S. PATENT DOCUMENTS

| 8,446,176 | B1 | 5/2013 | Yang |
| 2007/0240082 | A1 | 10/2007 | Davis |
| 2011/0049575 | A1 | 3/2011 | Tanaka |
(Continued)

FOREIGN PATENT DOCUMENTS

| DE | 102018129324 A1 | 5/2019 |
| DE | 102020116555 B3 | 7/2021 |
(Continued)

OTHER PUBLICATIONS

Chinese language office action dated Jul. 4, 2023, issued in application No. TW 111146946.

(Continued)

*Primary Examiner* — Marlon T Fletcher
*Assistant Examiner* — Da Wei Lee
(74) *Attorney, Agent, or Firm* — McClure, Qualey &
Rodack, LLP

(57) ABSTRACT

A semiconductor structure is provided. The semiconductor structure includes a cell array having a plurality of rows. The cell array includes a plurality of first logic cells arranged in at least one first row, and a plurality of second logic cells arranged in at least one second row. The first logic cells share a first active region. Each of the second logic cells has a second active region, and the second active regions of two adjacent second logic cells are separated from each other by an isolation structure. The first logic cells of the first row are in contact with the second logic cells of the second row.

16 Claims, 14 Drawing Sheets

(51) Int. Cl.
   *H10W 10/00*      (2026.01)
   *H10W 10/17*      (2026.01)

(56) References Cited

U.S. PATENT DOCUMENTS

| | | | |
|---|---|---|---|
| 2013/0207199 A1 | 8/2013 | Becker | |
| 2013/0228877 A1 | 9/2013 | Sugimoto | |
| 2014/0124868 A1* | 5/2014 | Kamal | H10D 84/85 |
| | | | 257/369 |
| 2015/0064864 A1* | 3/2015 | Bowers | H10D 84/907 |
| | | | 438/257 |
| 2017/0358565 A1* | 12/2017 | Hensel | H10D 84/907 |
| 2017/0365594 A1 | 12/2017 | Yang | |
| 2018/0102364 A1 | 4/2018 | Rastogi | |
| 2018/0269154 A1 | 9/2018 | Kishishita | |
| 2019/0164971 A1 | 5/2019 | Liaw | |
| 2019/0237542 A1 | 8/2019 | Chen | |
| 2019/0288069 A1 | 9/2019 | Liaw | |
| 2020/0020700 A1 | 1/2020 | Lin | |
| 2020/0066705 A1 | 2/2020 | Kim | |
| 2021/0265217 A1 | 8/2021 | Peng | |
| 2023/0135653 A1 | 5/2023 | Lee | |
| 2023/0140528 A1* | 5/2023 | Dimri | H10D 84/907 |
| | | | 257/207 |
| 2023/0178557 A1* | 6/2023 | Hsieh | H10D 84/0188 |
| 2023/0197821 A1 | 6/2023 | Liaw | |

FOREIGN PATENT DOCUMENTS

| | | |
|---|---|---|
| EP | 4027386 A2 | 7/2022 |
| TW | 202143488 A | 11/2021 |
| WO | 2009/053251 A1 | 4/2009 |

OTHER PUBLICATIONS

Chinese language office action dated Aug. 11, 2023, issued in application No. TW 111146944.

Non-Final Office Action dated Aug. 14, 2025, issued in U.S. Appl. No. 18/050,630.

German language office action dated Aug. 7, 2025, issued in application No. DE 10 2022 130 829.4 (English language translation, pp. 1-6 of attachment).

English language office action dated Feb. 6, 2026 issued in U.S. Appl. No. 18/050,630.

* cited by examiner

SEMICONDUCTOR STRUCTURE OF HYBRID CELL ARRAY

CROSS REFERENCE TO RELATED APPLICATIONS

This Application claims priority of U.S. Provisional Application No. 63/286,583, filed on Dec. 7, 2021, the entirety of which is incorporated by reference herein.

BACKGROUND OF THE INVENTION

Field of the Invention

The invention relates to a cell array, and more particularly to a hybrid cell array for power and speed.

Description of the Related Art

Integrated circuits (ICs) have become increasingly important. Applications using ICs are used by millions of people. These applications include cell phones, smartphones, tablets, laptops, notebook computers, PDAs, wireless email terminals, MP3 audio and video players, portable wireless web browsers, and so on. Integrated circuits increasingly include powerful and efficient on-board data storage and logic circuitry for signal control and processing.

As down-scaling of integrated circuits has increased, they have become more compact. When the number of standard cells (frequently used in integrated circuits) is increased, this increases the chip area. Therefore, a cell array for power and speed is desired.

BRIEF SUMMARY OF THE INVENTION

Semiconductor structures are provided. An embodiment of a semiconductor structure is provided. The semiconductor structure includes a cell array having a plurality of rows. The cell array includes a plurality of first logic cells arranged in at least one first row, and a plurality of second logic cells arranged in at least one second row. The first logic cells share a first active region. Each of the second logic cells has a second active region, and the second active regions of two adjacent second logic cells are separated from each other by an isolation structure. The first logic cells of the first row are in contact with the second logic cells of the second row.

Furthermore, an embodiment of a semiconductor structure is provided. The semiconductor structure includes a cell array having a plurality of rows. The rows are divided into a plurality of groups. Each of the groups includes a plurality of first logic cells arranged in a first row, and a plurality of second logic cells arranged in a second row. First conductivity type transistors of the first logic cells share a first continuous active region, and second conductivity type transistors of each of the first logic cells are formed in a first discontinuous active region. The first conductivity type transistors of each of the second logic cells are formed in a second discontinuous active region, and the first conductivity type transistors of the second logic cells share a second continuous active region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures.

Figure 1:
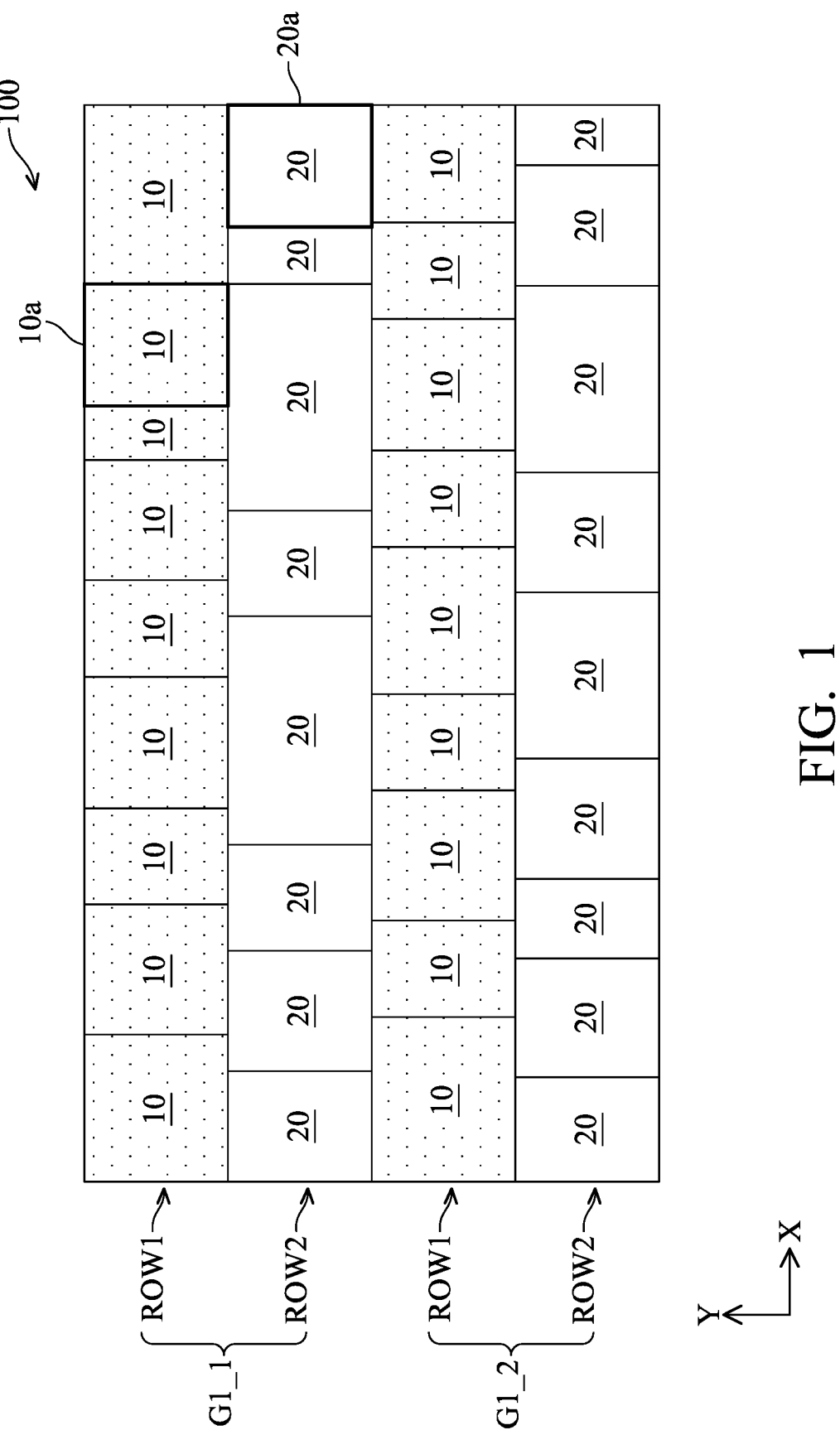
FIG. 1 shows a simplified diagram illustrating a cell array of an IC according to some embodiments of the invention.

FIG. 1 shows a simplified diagram illustrating a cell array 100 of an IC according to some embodiments of the invention. The cell array 100 is a hybrid cell array formed by multiple logic cells 10 and multiple logic cells 20. In the logic array 100, the number of rows including the logic cells 10 is equal to the number of rows including the logic cells 20, and the rows of the logic cells 10 and the rows of the logic cells 20 are alternately arranged in the cell array 100. For example, logic cells 10 are in odd rows of the cell array 100 and logic cells 20 are in even rows of the cell array 100. Furthermore, the logic cells 10 in the odd rows are in contact with the logic cells 20 in the even rows.

In some embodiments, the logic cells 10 and 20 are standard cells (e.g., INV (inverter), AND, OR, NAND, NOR, Flip-Flop, SCAN, etc.), or a combination of standard cells, or specific logic functional cells. Furthermore, the logic functions of the logic cells 10 or 20 may be the same or different. Furthermore, each of the logic cells 10 and 20 includes a plurality of transistors. It should be noted that the difference between the logic cell 10 and the logic cell 20 is that the logic cells 10 and 20 have different configurations in the active regions. The detailed configuration will be described later.

The logic cells 10 corresponding to the same function or operation may have the same circuit configuration with different semiconductor structures and/or different layouts. Similarly, the logic cells 20 corresponding to the same function or operation may have the same circuit configuration with different semiconductor structures and/or different layouts. Furthermore, the logic cells 10 in the same row have the same cell height (e.g., in the Y-direction) in the layout, and the logic cells 20 in the same row have the same cell height (e.g., in the Y-direction) in the layout. Furthermore, the logic cells 10 and 20 may have the same or different cell widths (e.g., in X-direction) in the layout. It should be noted that the number and the configuration of the logic cells 10 and 20 are used as an example, and not to limit the invention.

The logic cell 10 is capable of providing a specific logic function with small leakage and larger area benefit (e.g., more routing tracks), and the logic cell 20 is capable of providing a specific logic function with small cell delay (e.g., high speed). In some embodiments, the transistors in the logic cells 10 and 20 are selected from a group consisting of planar transistors, fin field effect transistors (FinFETs), vertical gate all around (GAA), horizontal GAA, nano wire, nano sheet, or a combination thereof.

In FIG. 1, the rows of the cell array 100 are divided into multiple groups G1 (labeled as G1_1 and G1_2). Each of the groups G1_1 and G1_2 includes the rows ROW1 and ROW2. In each of the groups G1_1 and G1_2, the logic cells 10 are arranged in the row ROW1, and the logic cells 20 are arranged in the row ROW2. It should be noted that the row number in the group G1 and the group number of groups G1 in the cell array 100 are used as an example, and not to limit the invention. In such embodiment, the group G1 includes one row formed by the logic cells 10 and another row formed by the logic cells 20, and can be used as a unit to form the logic array 100. By repeatedly arranging the groups G1, the larger logic array 100 is obtained.

Figure 2:
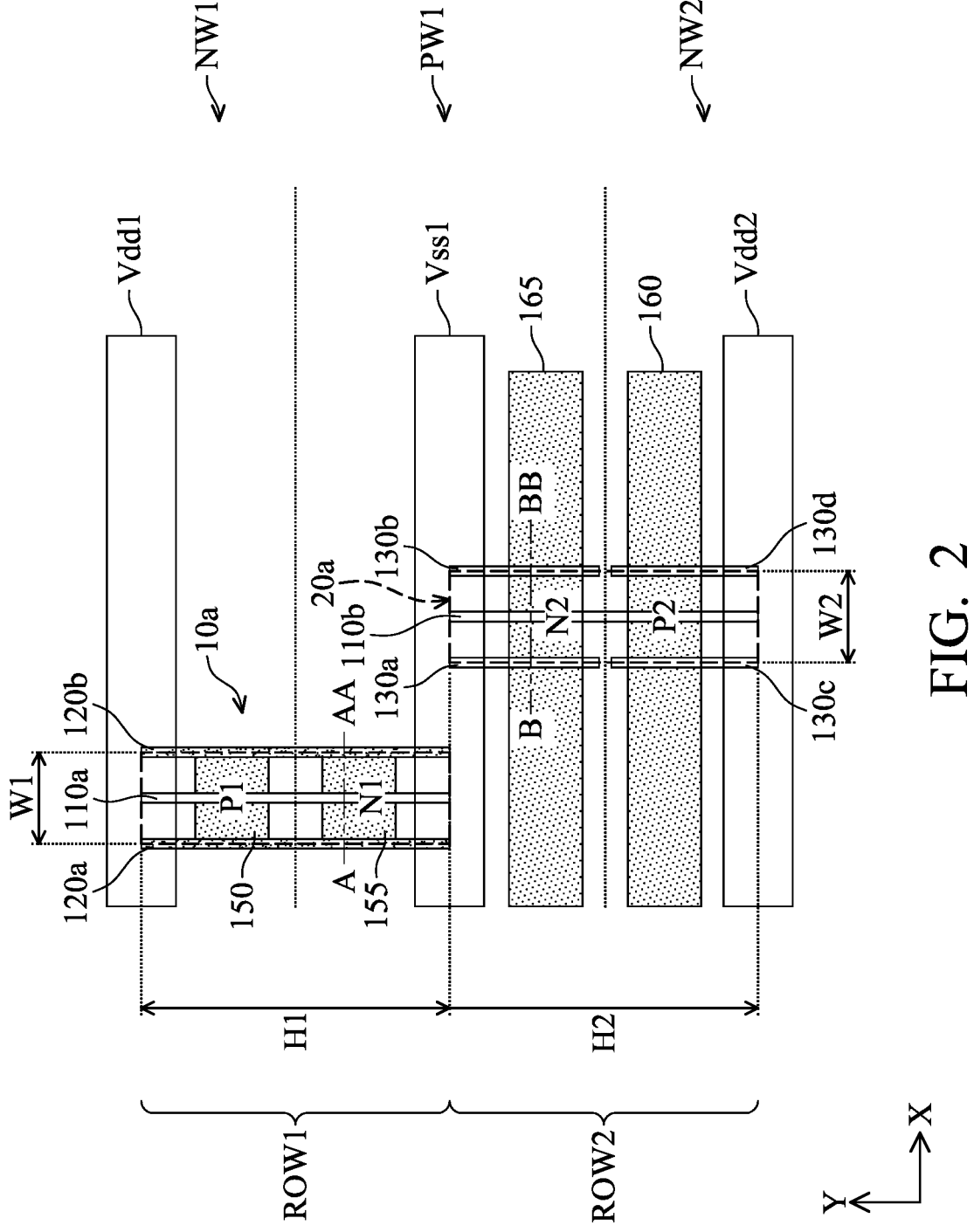
FIG. 2 shows a simplified layout illustrating the logic cells of the group in the cell array of FIG. 1 according to some embodiments of the invention.

FIG. 2 shows a simplified layout illustrating the logic cells 10a and 20a of the group G1_1 in the cell array 100 of FIG. 1 according to some embodiments of the invention. The logic cell 10a of the row ROW1 is arranged between a power line Vdd1 (e.g., VDD line, a first power line or a first power supply line) and a ground line Vss1 (e.g., VSS line, a second power line or a second power supply line), and the logic cell 10a has a cell height H1 and a cell weight W1. The logic cell 20a of the row ROW2 is arranged between a power line Vdd2 and the ground line Vss1, and the logic cell 20a has a cell height H2 and a cell weight W2. In some embodiments, the logic cells 10a and 20a have the same size, i.e., the cell height H1 is equal to the cell height H2 and the cell weight W1 is equal to the cell weight W2. In some embodiments, the logic cells 10a and 20a have different sizes, i.e., the cell height H1 is greater than or less than the cell height H2 or the cell weight W1 is greater than or less than the cell weight W2. Furthermore, the outer boundaries of the logic cells 10a and 20a are illustrated using dashed lines. The power line Vdd1 and the ground line Vss1 extending in the X-direction are main power supply lines for the logic cells 10 in the row ROW1, and the power line Vdd2 and the ground line Vss1 extending in the X-direction are main power supply lines for the logic cells 20 in the row ROW2.

In the row ROW1, the logic cell 10a includes a P-type transistor P1 over an N-type well region NW1 and an N-type transistor N1 over a P-type well region PW1. The P-type transistor P1 and the N-type transistor N1 are configured to perform a specific logic function for the logic cell 10a, such as an inverter. It should be noted that the number of transistors in the logic cell 10a is used as an example, and not to limit the disclosure. The logic cell 10a may include more P-type transistors and more N-type transistors to perform a specific function.

In the logic cell 10a, a gate structure 110a extending in the Y-direction forms the P-type transistor P1 in the discontinuous active region 150 of the N-type well region NW1. Moreover, the gate structure 110a forms the N-type transistor N1 in the discontinuous active region 155 of the P-type well region PW1. In order to simplify, detail of the gate structure 110a, such as the gate dielectric, the gate electrode and so on, and corresponding source/drain regions, will be omitted. The isolation structures 120a and 120b extending in the Y-direction are arranged in the boundary of the logic cell 10a over the P-type well region PW1 and the N-type well region NW1. In other words, the isolation structures 120a and 120b are arranged on the opposite sides of the N-type transistor N1 and the P-type transistor P1. In some embodiments, the gate structure 110a and the isolation structures 120a and 120b have the same length in the Y-direction. In the logic cell 10a, the gate structure 110a and the isolation structures 120a and 120b are arranged with a fixed pitch. For example, the isolation structure 120a, the isolation structure 110a and the isolation structure 120b are arranged in sequence according to the fixed pitch.

In some embodiments, the isolation structures 120a and 120b are formed by performing a cut metal gate (CMG) process or a cut poly (CPO) process on the gate structures that have the same length as the gate structure 110a. Next, the gate features of the gate structures over the P-type well region PW1 and the N-type well region NW1 are replaced with the dielectric-base material to form the isolation structures 120a and 120b.

The power line Vdd1 and the ground line Vss1 are formed in the same metal layer, e.g., the lowest metal layer. In some embodiments, the power line Vdd1 and the ground line Vss1 have the same width in the Y-direction. The discontinuous active regions 150 and 155 are arranged between the power line Vdd1 and the ground line Vss1. Multiple signal lines (not shown) extending in the X-direction may arranged between the power line Vdd1 and the ground line Vss1. Furthermore, the signal lines, the power line Vdd1 and the ground line Vss1 are formed in the same metal layer. Furthermore, the signal lines are narrower than the power line Vdd1 and the ground line Vss1.

In the logic cell 10a, each of the discontinuous active regions 150 and 155 is formed by a diffusion break (DB) region. In the row ROW1, the discontinuous active region 150 of the logic cell 10a is separated from the discontinuous active region 150 of the adjacent logic cells 10 by the isolation structures 120a and 120b, and the discontinuous active region 155 of the logic cell 10a is separated from the discontinuous active region 155 of the adjacent logic cells 10 by the isolation structures 120a and 120b. In some embodiments, the isolation structure 120a and 120b may be the DB structure. In some embodiment, the isolation structure 120a and 120b may be the shallow trench isolation (STI). In some embodiments, the isolation structure 120a and 120b may be the dielectric-base dummy gate.

In the row ROW2, the logic cell 20a includes a P-type transistor P2 over an N-type well region NW2 and an N-type transistor N2 over the P-type well region PW1. The P-type transistor P2 and the N-type transistor N2 are configured to perform a specific logic function for the logic cell 20a, such as an inverter. It should be noted that the number of transistors in the logic cell 20a is used as an example, and not to limit the disclosure. The logic cell 20a may include more P-type transistors and more N-type transistors to perform a specific function.

In the logic cell 20a, a gate structure 110b extending in the Y-direction forms the P-type transistor P2 in the continuous active region 160 of the N-type well region NW2. Moreover, the gate structure 110b forms the N-type transistor N2 in the continuous active region 165 of the P-type well region PW1. The continuous active regions 160 and 165 extend in the X-direction. In other words, the continuous active region 160 is parallel to the continuous active region 165. In order to simplify, detail of the gate structure 110b, such as the gate dielectric, the gate electrode and so on, and corresponding source/drain regions, will be omitted.

The power line Vdd2 and the ground line Vss1 are formed in the same metal layer, e.g., the lowest metal layer. In some embodiments, the power line Vdd2 and the ground line Vss1 have the same width in the Y-direction. The continuous active regions 160 and 165 are arranged between the power line Vdd2 and the ground line Vss1. Multiple signal lines (not shown) extending in the X-direction may arranged between the power line Vdd2 and the ground line Vss1. Furthermore, the signal lines, the power line Vdd2 and the ground line Vss1 are formed in the same metal layer. Furthermore, the signal lines are narrower than the power line Vdd2 and the ground line Vss1.

In the logic cell 20a, the continuous active region 160 is formed by a continuous oxide diffusion region over the N-type well region NW2, and the continuous active region 165 is formed by a continuous oxide diffusion region over the P-type well region PW1.

The gate structures 130a and 130b extending in the Y-direction are arranged in the boundary of the logic cell 20a over the P-type well region PW1, and the gate structures 130c and 130d extending in the Y-direction are arranged in the boundary of the logic cell 20a over the N-type well region NW2. The gate structures 130a, 130b, 130c and 130d are shorter than the gate structure 110b in the Y-direction. In some embodiments, the gate structures 130a, 130b, 130c and 130d have the same length in the Y-direction. In the Y-direction, the gate structure 130a is aligned with the gate structure 130c, and the gate structure 130b is aligned with the gate structure 130d. Furthermore, the gate structures 130a and 130b do not contact the gate structures 130c and 130d, i.e., the gate structure 130a is separated from the gate structure 130c by a dielectric material (not shown), and the gate structure 130b is separated from the gate structure 130d by a dielectric material (not shown). In other words, the gate structures 130a and 130b and the gate structures 130c and 130d do not cross the interface between the N-type well region NW2 and the P-type well region PW1.

The gate structures 130a and 130b are formed over the continuous active region 165, and are electrically connected to the ground line Vss1 through the connect features (e.g., a gate via (not shown) between the gate structure 130a/130b and the ground line Vss1). Thus, the gate structure 130a/130b and the corresponding source/drain features (i.e., the source/drain features (not shown) on the opposite sides of the gate structure 130a/130b) form a dummy transistor that is an N-type transistor turned off by the ground line Vss1.

The gate structures 130c and 130d are formed over the continuous active region 160, and are electrically connected to the power line Vdd2 through the connect features (e.g., a gate via (not shown) between the gate structure 130c/130d and the power line Vdd2). Thus, the gate structure 130c/130d and the corresponding source/drain features (i.e., the source/drain features (not shown) on the opposite sides of the gate structure 130c/130d) form a dummy transistor that is a P-type transistor turned off by the power line Vdd2.

Figure 3B:
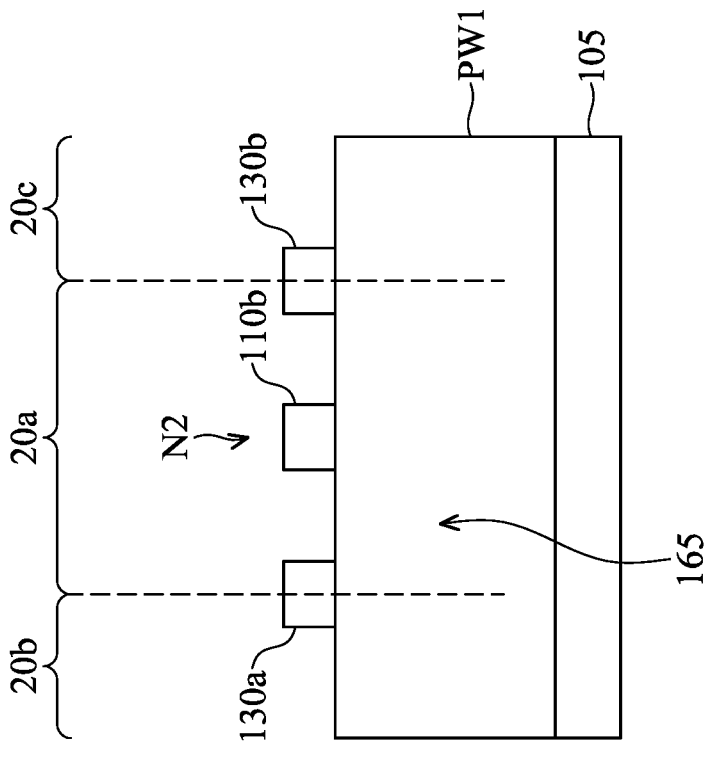
FIG. 3B shows a cross-sectional view of the semiconductor structure of the logic cell along line B-BB of FIG. 2 according to some embodiments of the invention.
Figure 3A:
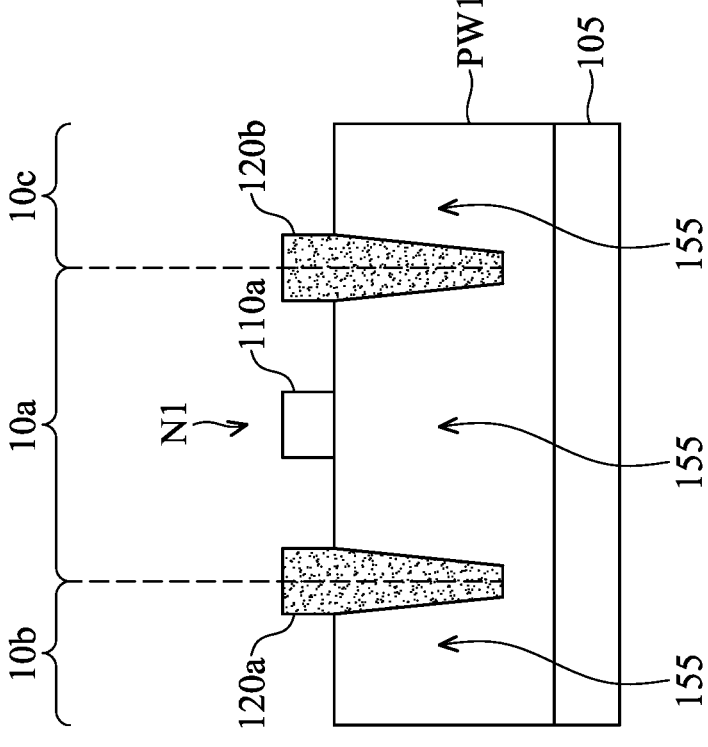
FIG. 3A shows a cross-sectional view of the semiconductor structure of the logic cell along line A-AA of FIG. 2 according to some embodiments of the invention.

FIG. 3A shows a cross-sectional view of the semiconductor structure of the logic cell 10a along line A-AA in the row ROW1 of FIG. 2 according to some embodiments of the invention. The P-type well region PW1 is formed over a semiconductor substrate 105. In some embodiments, the semiconductor substrate 105 is a Si substrate. In some embodiments, the material of the semiconductor substrate 105 is selected from a group consisting of bulk-Si, SiP, SiGe, SiC, SiPC, Ge, SOI-Si, SOI-SiGe, III-VI material, or a combination thereof.

The gate structure 110a extending in the Y-direction forms the N-type transistor N1 in the discontinuous active region 155 of the P-type well region PW1. In order to simplify, the source/drain regions of the N-type transistor N1 are omitted. The isolation structures 120a and 120b extending in the Y-direction are arranged in the boundary of the logic cell 10a over the P-type well region PW1. The isolation structures 120a and 120b are arranged on the opposite edges of the discontinuous active region 155.

The isolation structure 120a is shared by the logic cell 10a and the adjacent logic cell 10 (for example marked as 10b), and the isolation structure 120b is shared by the logic cell 10a and the adjacent logic cell 10 (for example marked as 10c). Thus, the discontinuous active regions 155 of the logic cell 10a and 10b are separated from each other by the isolation structure 120a, and the discontinuous active regions 155 of the logic cell 10a and 10c are separated from each other by the isolation structure 120b. In other word, the N-type transistors of each logic cell 10 are formed in the respective discontinuous active region 155. Therefore, in the row ROW1, the number of logic cells 10 is equal to the number of discontinuous active regions 155. Similarly, the number of logic cells 10 is also equal to the number of discontinuous active regions 150.

In the logic cell 10a, the isolation structures 120a and 120b are formed by a dielectric material. Compared with the gate structures 130a through 130d of the logic cell 20a, the isolation structures 120a and 120b does not require electrical connection to the power lines Vdd1 and Vdd2 and the ground line Vss1 through connection features. Thus, the space above the isolation structures 120a and 120b can be reserved for track routing.

FIG. 3B shows a cross-sectional view of the semiconductor structure of the logic cell 20a along line B-BB in the row ROW2 of FIG. 2 according to some embodiments of the invention. The P-type well region PW1 is formed over the semiconductor substrate 105.

The gate structure 110b extending in the Y-direction forms the N-type transistor N2 in the continuous active region 165 of the P-type well region PW1. In order to simplify, the source/drain regions of the N-type transistor N2 are omitted. The gate structures 130a and 130b extending in the Y-direction are arranged in the boundary of the logic cell 20a over the P-type well region PW1. The gate structures 130a and 130b are arranged on the opposite edges of the N-type transistor N2.

The gate structure 130a is shared by the logic cell 20a and the adjacent logic cell 20 (for example marked as 20b), and the gate structure 130b is shared by the logic cell 20a and the adjacent logic cell 20 (for example marked as 20c). Compared with the logic cell 10a of FIG. 3A, the continuous active region 165 extends from the logic cell 20b to the logic cell 20c. In other word, the logic cells 20 in the same row share the same continuous active region 165, i.e., the logic cells 20 are formed in the same continuous active region 165. Therefore, in the row ROW2, the number of continuous active region 165 and the number of continuous active region 160 are 1, and the number of logic cells 20 is greater than the number of continuous active region 160 or 165.

In the logic cells 20 of the same row, no diffusion edge is formed in the continuous active regions 160 and 165, thereby avoid diffusion break stress. Thus, the saturation drain current (Idsat) of the transistors in the logic cell 20 will not be degraded, and then operation speed of the logic cell 20 is increased.

Figure 4:
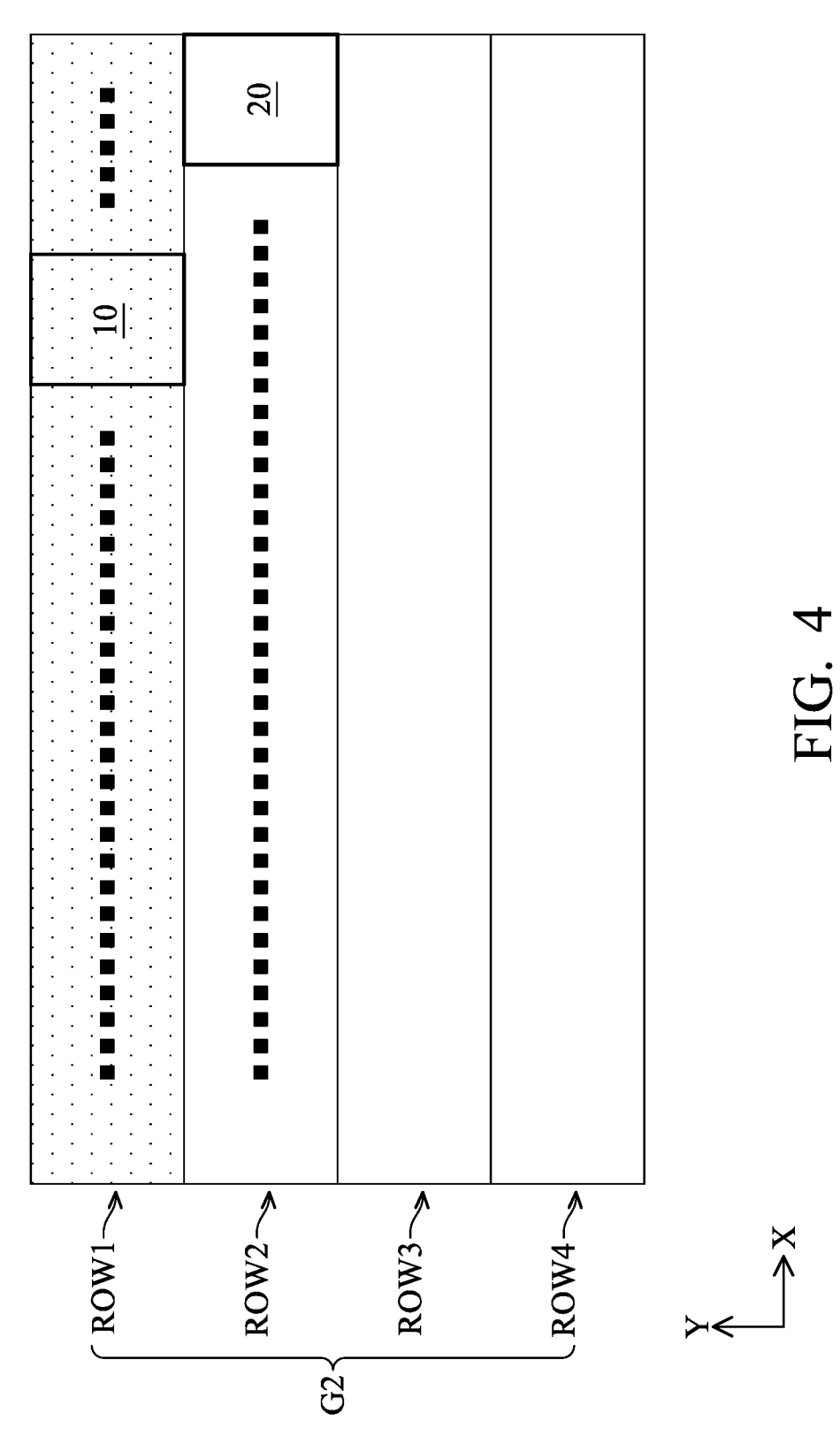
FIG. 4 shows a simplified diagram illustrating a cell array of an IC according to some embodiments of the invention.

FIG. 4 shows a simplified diagram illustrating a cell array 200 of an IC according to some embodiments of the invention. The cell array 200 is a hybrid cell array formed by multiple logic cells 10 and multiple logic cells 20. In such embodiment, the cell array 200 includes the rows ROW1 through ROW4 that formed a group G2. In the group G2, the logic cells 10 are arranged in the row ROW1 and the logic cells 20 are arranged in the rows ROW2, ROW3 and ROW4.

In the cell array 200, the number of rows including the logic cells 10 is different from the number of rows including the logic cells 20. In such embodiment, the number of rows including the logic cells 10 is less than the number of rows including the logic cells 20. In some embodiments, the number of rows including the logic cells 10 is greater than the number of rows including the logic cells 20.

As described above, the logic cells 10 in the row ROW1 have the same cell height (e.g., the cell height H1) in the layout, and the logic cells 20 in the same row (the row ROW2, ROW3 or ROW4) have the same cell height (e.g., the cell height H2) in the layout.

In the row ROW1, each logic cell 10 has its own discontinuous active region 150 for the P-type transistors and its own discontinuous active region 155 for the N-type transistors. Each of the discontinuous active regions 150 and 155 is formed by a diffusion break region. Furthermore, the discontinuous active regions 150 of the logic cells 10 in the row ROW1 are separated from each other by the isolation structures (e.g., the isolation structures 120a and 120b) Similarly, the discontinuous active regions 155 of the logic cells 10 in the row ROW1 are also separated from each other by the isolation structures.

In the rows ROW2, ROW3 and ROW4, the logic cells 20 in the same row have the common continuous active region 160 for the P-type transistors and the common continuous active region 165 for the N-type transistors. Each of the continuous active regions 160 and 165 is formed by a continuous oxide diffusion region. Therefore, no isolation structure is formed in the rows ROW2, ROW3 and ROW4. Furthermore, the lengths of the continuous active regions 160 and 165 in the rows ROW2, ROW3 and ROW4 are the same, and the lengths of the continuous active regions 160 and 165 in the rows ROW2, ROW3 and ROW4 are greater than the lengths of the discontinuous active regions 150 and 155 in the row ROW1.

Figure 5A:
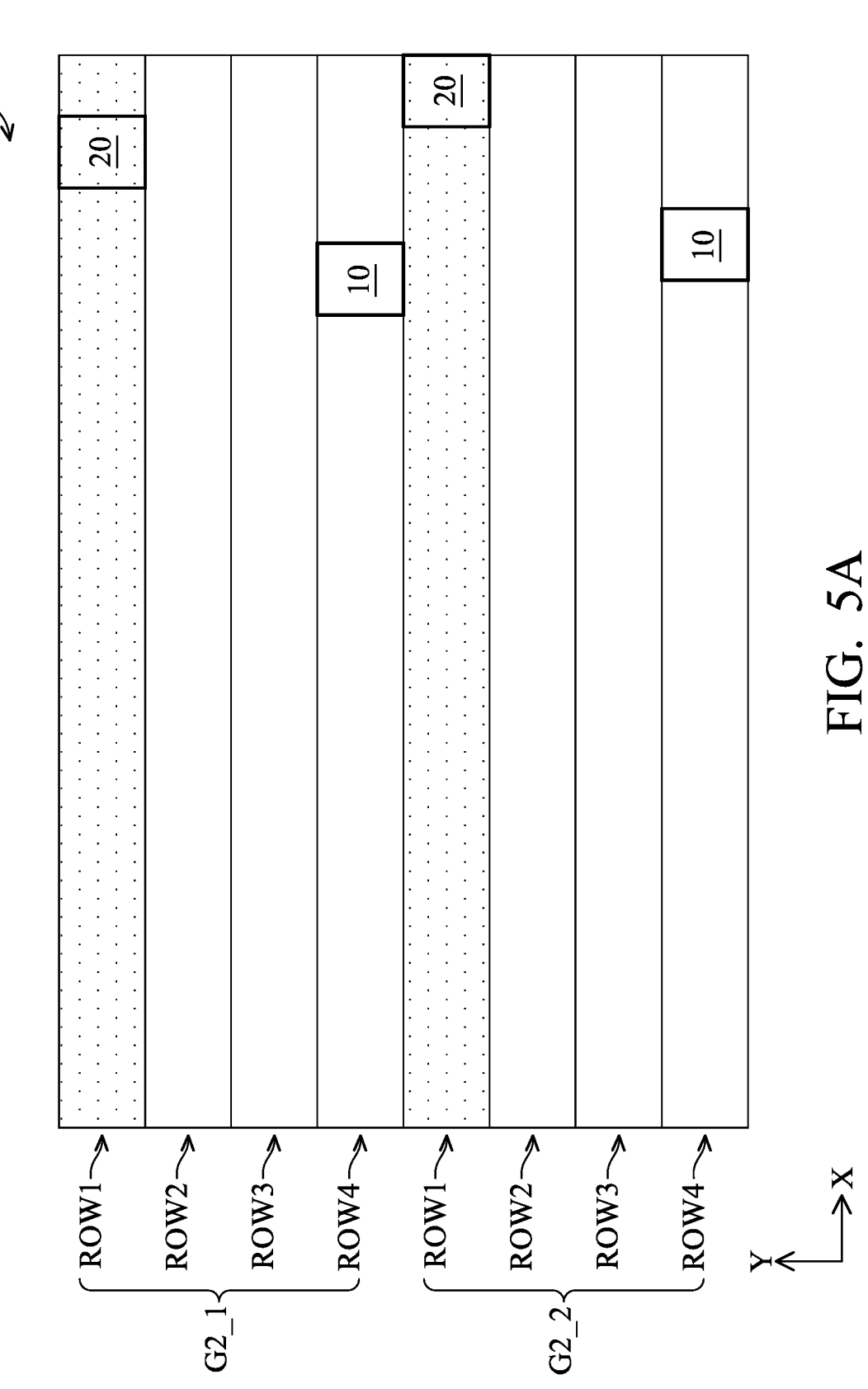
FIG. 5A shows a simplified diagram illustrating a cell array according to some embodiments of the invention.

FIG. 5A shows a simplified diagram illustrating a cell array 200A according to some embodiments of the invention. In the cell array 200A, the group G2 of FIG. 4 is used as a unit to form the logic array 200A. In FIG. 5A, the rows of the cell array 200A are divided into multiple groups G2 (labeled as G2_1 and G2_2). Similar to the group G2 of FIG. 4, each of the groups G2_1 and G2_2 includes the rows ROW1 through ROW4. In the groups G2_1 and G2_2, the logic cells 10 having the discontinuous active regions 150 and 155 are arranged in the row ROW1, and the logic cells 20 having the continuous active regions 160 and 165 are arranged in the rows ROW2, ROW3 and ROW4. Moreover, the row ROW1 of the group G2_2 is disposed to adjacent the row ROW4 of the group G2_1.

Figure 5B:
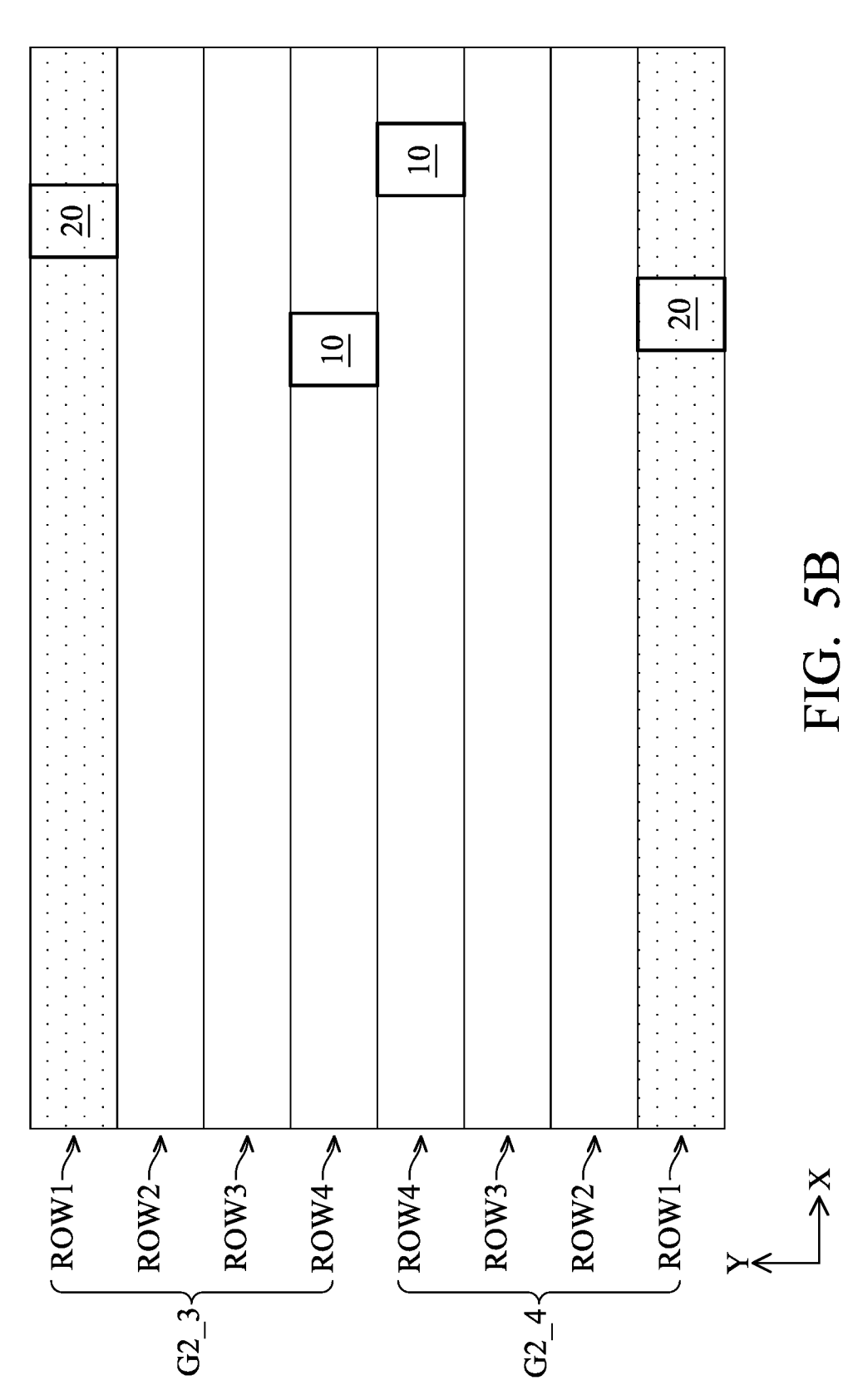
FIG. 5B shows a simplified diagram illustrating a cell array according to some embodiments of the invention.

FIG. 5B shows a simplified diagram illustrating a cell array 200B according to some embodiments of the invention. In the cell array 200B, the group G2 of FIG. 4 is used as a unit to form the logic array 200B. In FIG. 5B, the rows of the cell array 200B are divided into the groups G2 (labeled as G2_3 and G2_4). Similar to the group G2 of FIG. 4, each of the groups G2_3 and G2_4 includes the rows ROW1 through ROW4. In the cell array 200B, the row configurations of the logic cells 10 and 20 of the groups G2_3 and G2_4 are arranged symmetrically (i.e., mirrored). For example, the row ROW4 of the group G2_4 is disposed to adjacent the row ROW4 of the group G2_3. Furthermore, the rows ROW2 through ROW4 of the groups G2_3 and G2_4 are surrounded by the rows ROW1 of the groups G2_3 and G2_4.

Figure 6A:
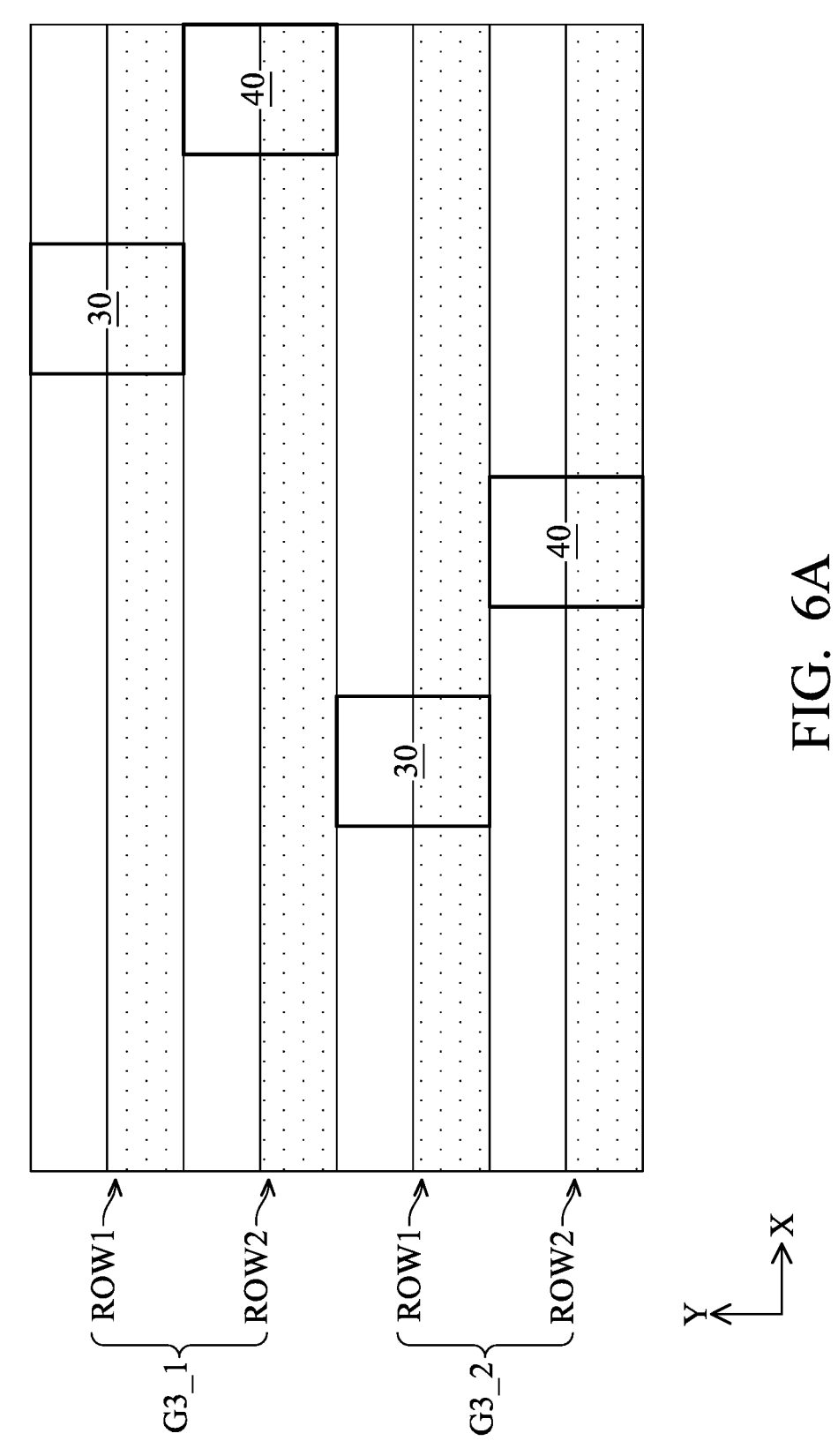
FIG. 6A shows a simplified diagram illustrating a cell array of an IC according to some embodiments of the invention.

FIG. 6A shows a simplified diagram illustrating a cell array 300 of an IC according to some embodiments of the invention. The cell array 300 is a hybrid cell array formed by multiple logic cells 30 and multiple logic cells 40. In such embodiment, the rows of the cell array 300 are divided into the groups G3 (labeled as G3_1 and G3_2), and the groups G3_1 and G3_2 have the same row configurations. Each of the groups G3_1 and G3_2 includes the rows ROW1 and ROW2. The logic cells 30 are arranged in the row ROW1, and the logic cells 40 are arranged in the rows ROW2.

In some embodiments, the logic cells 30 and 40 are the standard cells (e.g., INV (inverter), AND, OR, NAND, NOR, Flip-Flop, SCAN, etc.), a combination thereof or specific logic functional cells. Furthermore, the logic functions of the logic cells 30 or 40 may be the same or different. Furthermore, each of the logic cells 30 and 40 includes a plurality of transistors. It should be noted that the difference between the logic cell 30 and the logic cell 40 is that the logic cells 30 and 40 have different configurations in the active regions. The detailed configuration will be described later.

Each logic cell 30 has its own discontinuous active region 155 for the N-type transistors. Each discontinuous active region 155 is formed by a diffusion break region. Furthermore, the discontinuous active regions 155 of the logic cells 30 are separated from each other by the isolation structures (e.g., the isolation structures 120a and 120b). The logic cells 30 in the same row share the same continuous active region 160 for the P-type transistors.

Each logic cell 40 has its own discontinuous active region 150 for the P-type transistors. Each discontinuous active region 150 is formed by a diffusion break region. Furthermore, the discontinuous active regions 150 of the logic cells 40 are separated from each other by the isolation structures (e.g., the isolation structures 120a and 120b). The logic cells 40 in the same row share the same continuous active region 165 for the N-type transistors.

In each of the groups G3_1 and G3_2, the discontinuous active regions 155 in the row ROW1 are surrounded by the continuous active region 160 in the row ROW1 and the continuous active region 165 in the row ROW2. Furthermore, the continuous active region 165 in the row ROW2 is surrounded by the discontinuous active regions 155 in the row ROW1 and the discontinuous active regions 150 in the row ROW2.

Figure 6B:
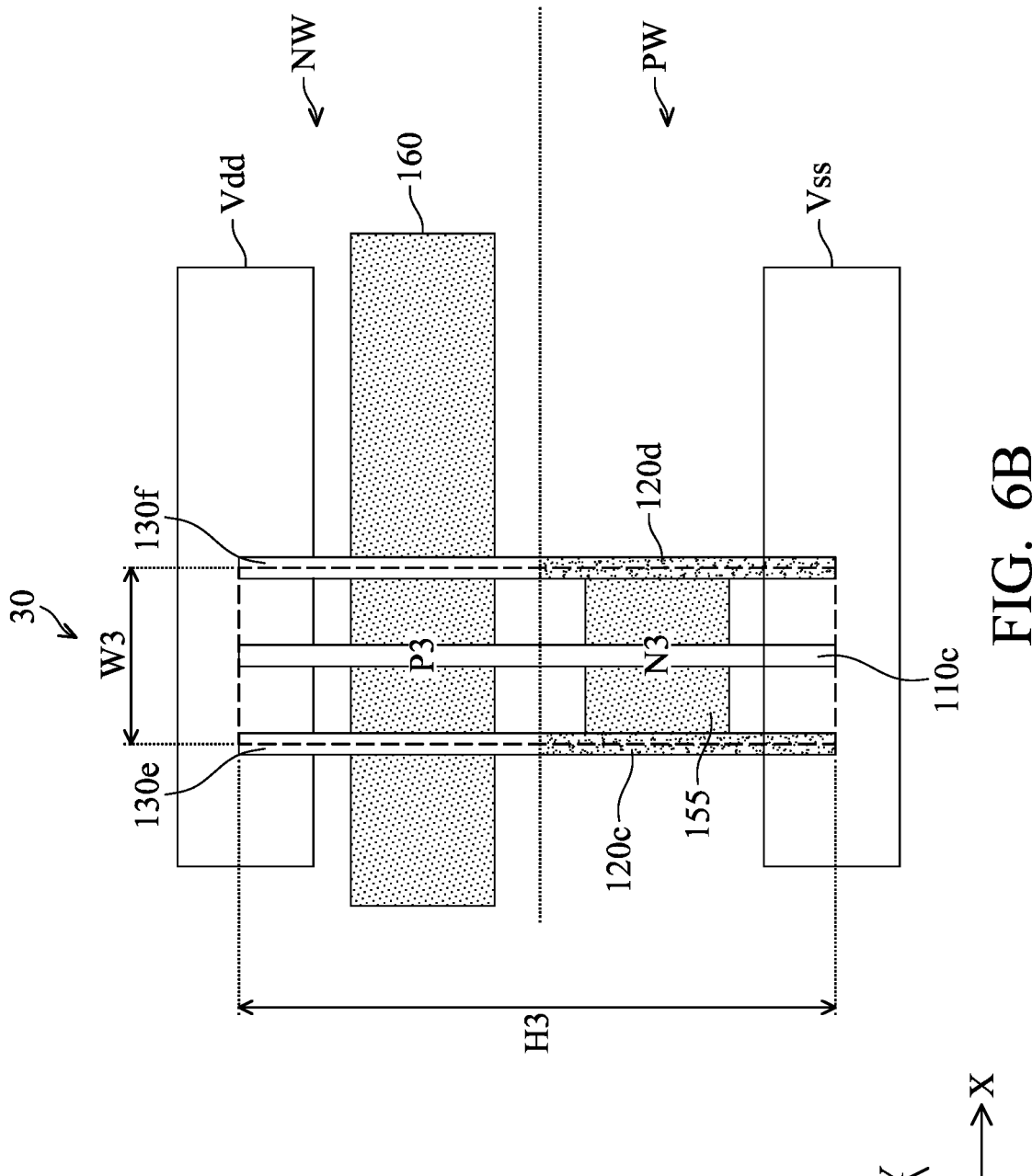
FIG. 6B shows a simplified layout illustrating the logic cell in FIG. 6A according to some embodiments of the invention.

FIG. 6B shows a simplified layout illustrating the logic cell 30 in FIG. 6A according to some embodiments of the invention. The logic cell 30 is arranged between the power line Vdd and the ground line Vss, and the logic cell 30 has a cell height H3 and a cell weight W3. Furthermore, the outer boundary of the logic cell 30 is illustrated using dashed lines. The logic cell 30 includes a P-type transistor P3 over the N-type well region NW and an N-type transistor N3 over the P-type well region PW. The P-type transistor P3 and the N-type transistor N3 are configured to perform a specific logic function for the logic cell 30, such as an inverter. It should be noted that the number of transistors in the logic cell 30 is used as an example, and not to limit the disclosure. The logic cell 30 may include more P-type transistors and more N-type transistors to perform a specific function.

In the logic cell 30, a gate structure 110c extending in the Y-direction forms the P-type transistor P3 in the continuous active region 160 of the N-type well region NW. Moreover, the gate structure 110c forms the N-type transistor N3 in the discontinuous active region 155 of the P-type well region PW. The gate structures 130e and 130f extending in the Y-direction are arranged in the boundary of the logic cell 30 over the N-type well region NW. In some embodiments, the gate structures 110c, 130e and 130f have the same structure. In order to simplify, detail of the gate structures 110c, 130e and 130f, such as the gate dielectric, the gate electrode and so on, and corresponding source/drain regions, will be omitted.

The isolation structures 120c and 120d extending in the Y-direction are arranged in the boundary of the logic cell 30 over the P-type well region PW. In other words, the gate structures 130e and 130f are arranged on the opposite side of the P-type transistor P3, and the isolation structures 120c and 120d are arranged on the opposite side of the N-type transistor N3. It should be noted that the gate structures 130e and 130f and the isolation structures 120c and 120d are shorter than the gate structure 110c. In some embodiments, the gate structures 130e and 130f and the isolation structures 120c and 120d have the same length in the Y-direction.

In some embodiments, the isolation structures 120c and 120d are formed by performing a cut metal gate process or a cut poly process on the gate structures 130e and 130f that have the same length as the gate structure 110c. Next, the gate features of the gate structures 130e and 130f over the P-type well region PW are replaced with the dielectric-base material to form the isolation structures 120c and 120d.

Figure 6C:
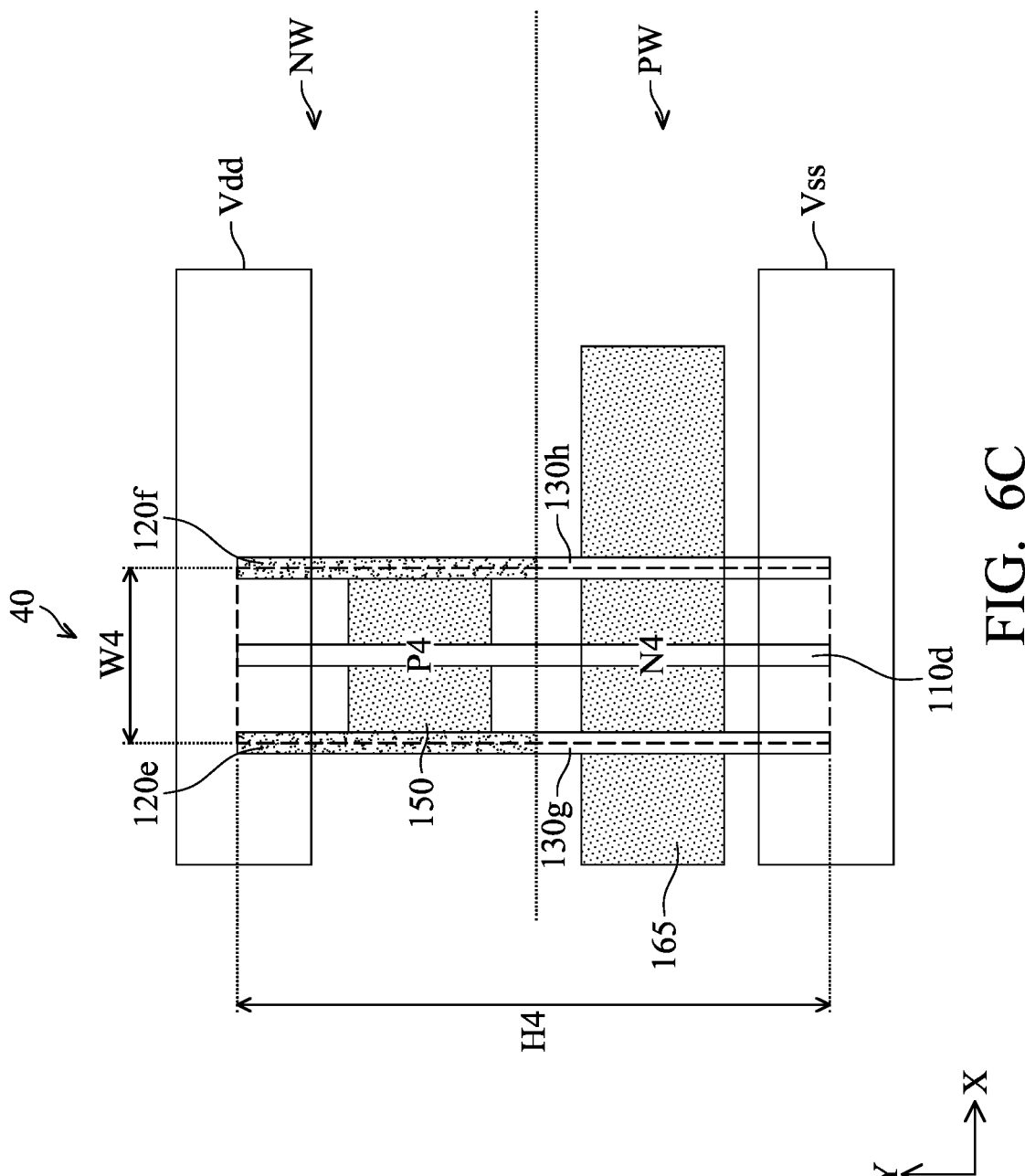
FIG. 6C shows a simplified layout illustrating another logic cell in FIG. 6A according to some embodiments of the invention.

FIG. 6C shows a simplified layout illustrating the logic cell 40 in FIG. 6A according to some embodiments of the invention. The logic cell 40 is arranged between the power line Vdd and the ground line Vss, and the logic cell 40 has a cell height H4 and a cell weight W4. Furthermore, the outer boundary of the logic cell 40 is illustrated using dashed lines. The logic cell 40 includes a P-type transistor P4 over the N-type well region NW and an N-type transistor N4 over the P-type well region PW. The P-type transistor P4 and the N-type transistor N4 are configured to perform a specific logic function for the logic cell 40, such as an inverter. It should be noted that the number of transistors in the logic cell 40 is used as an example, and not to limit the disclosure. The logic cell 40 may include more P-type transistors and more N-type transistors to perform a specific function.

In the logic cell 40, a gate structure 110d extending in the Y-direction forms the P-type transistor P4 in the discontinuous active region 150 of the N-type well region NW. Moreover, the gate structure 110d forms the N-type transistor N4 in the continuous active region 165 of the P-type well region PW. The gate structures 130g and 130h extending in the Y-direction are arranged in the boundary of the logic cell 40 over the P-type well region PW. In some embodiments, the gate structures 110d, 130g and 130h have the same structure. In order to simplify, detail of the gate structures 110d, 130g and 130h, such as the gate dielectric, the gate electrode and so on, and corresponding source/drain regions, will be omitted.

The isolation structures 120e and 120f extending in the Y-direction are arranged in the boundary of the logic cell 40 over the N-type well region NW. In other words, the gate structures 130g and 130h are arranged on the opposite side of the N-type transistor N4, and the isolation structures 120e and 120f are arranged on the opposite side of the P-type transistor P4. It should be noted that the gate structures 130g and 130h and the isolation structures 120e and 120f are shorter than the gate structure 110d. In some embodiments, the gate structures 130g and 130h and the isolation structures 120e and 120f have the same length in the Y-direction.

Figure 7:
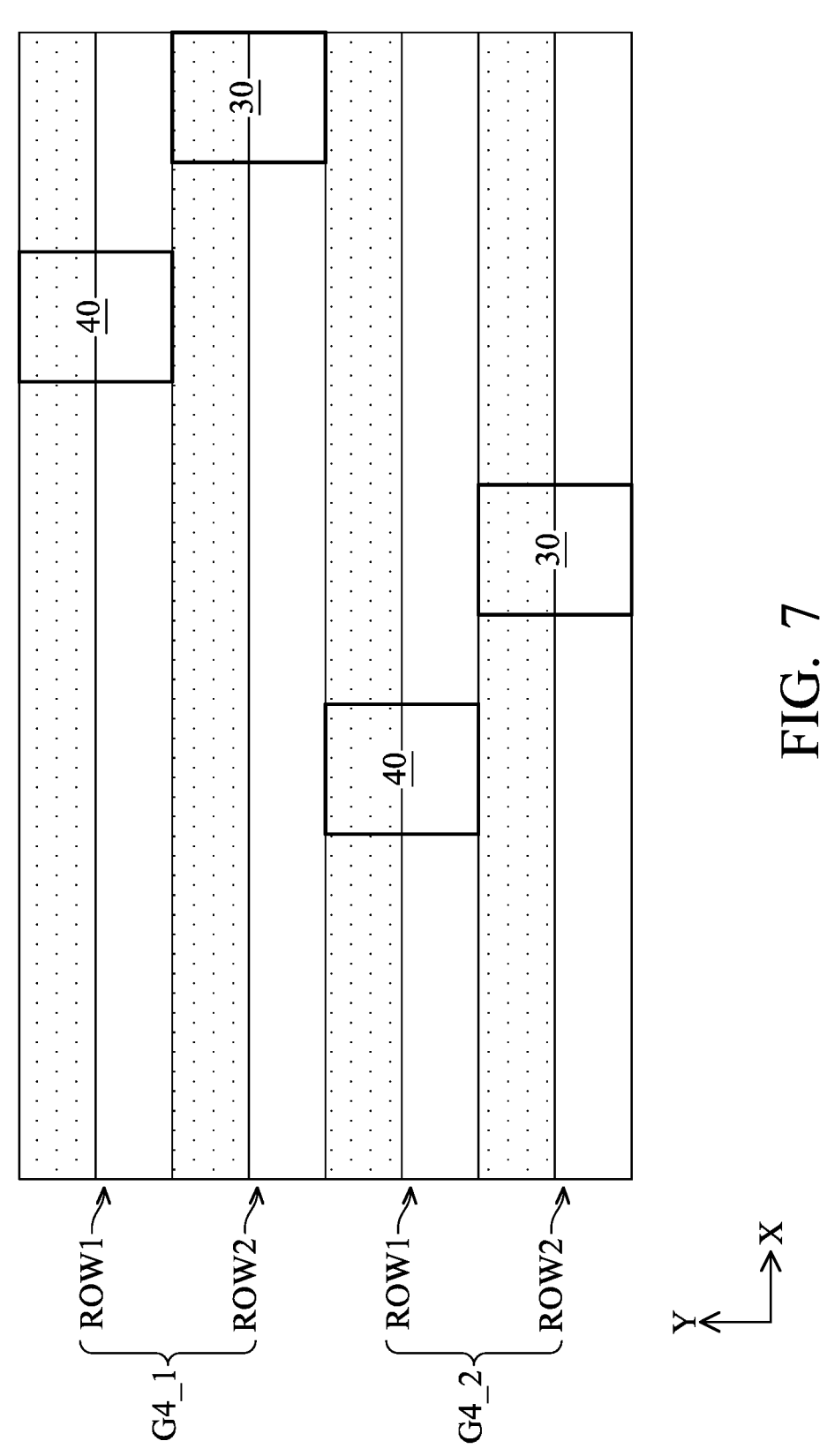
FIG. 7 shows a simplified diagram illustrating a cell array of an IC according to some embodiments of the invention.

FIG. 7 shows a simplified diagram illustrating a cell array 400 of an IC according to some embodiments of the invention. The cell array 400 is a hybrid cell array formed by multiple logic cells 30 and multiple logic cells 40. In such embodiment, the rows of the cell array 400 are divided into the groups G4 (label as G4_1 and G4_2), and the groups G4_1 and G4_2 have the same row configurations. Each of the groups G4_1 and G4_2 includes the rows ROW1 and ROW2. The logic cells 40 are arranged in the row ROW1, and the logic cells 30 are arranged in the rows ROW2.

In each of the groups G4_1 and G4_2, the discontinuous active regions 155 in the row ROW2 are surrounded by the continuous active region 165 in the row ROW1 and the continuous active region 160 in the row ROW2. Furthermore, the continuous active region 165 in the row ROW1 is surrounded by the discontinuous active regions 150 in the row ROW1 and the discontinuous active regions 155 in the row ROW2.

Figure 8:
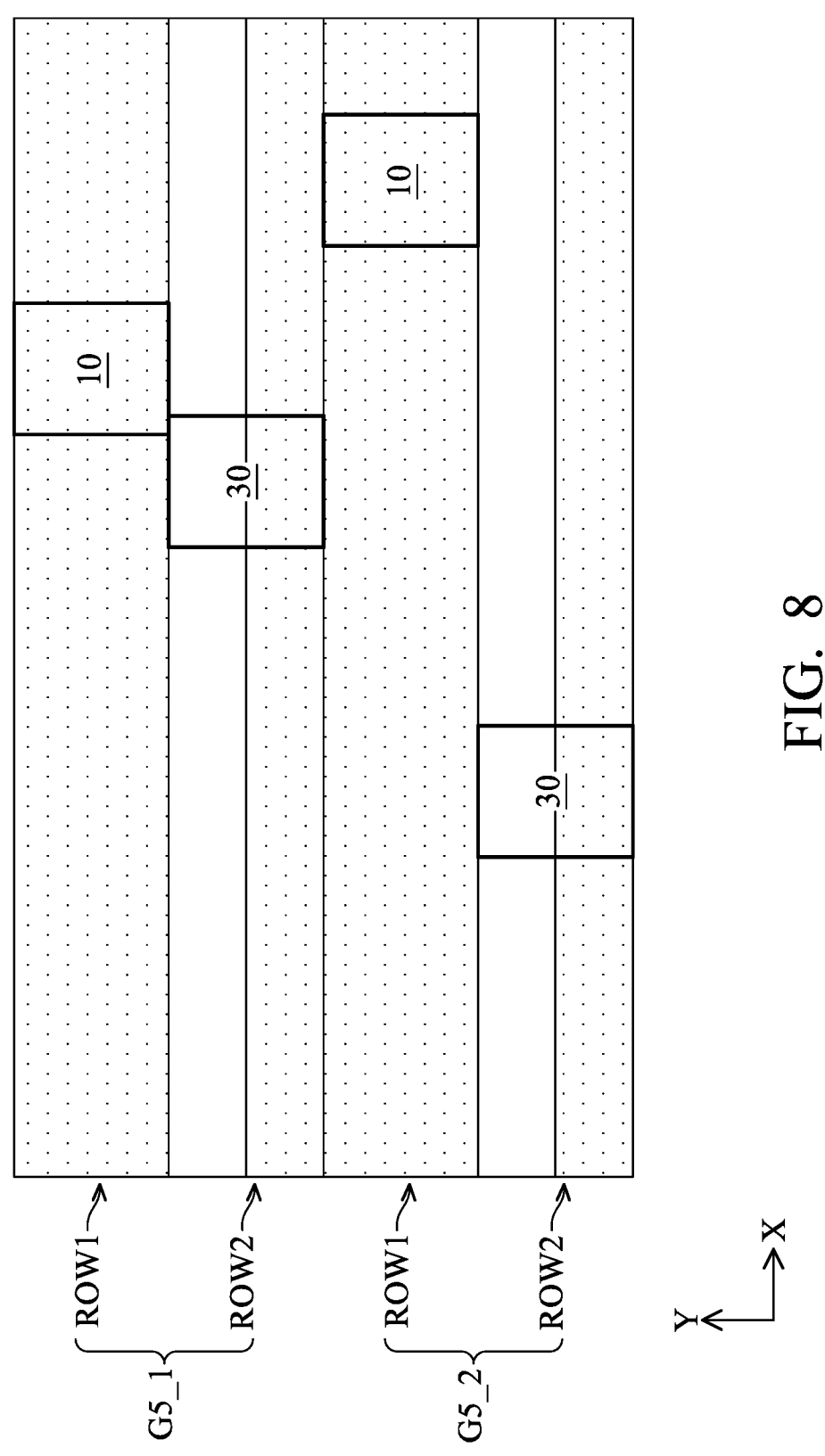
FIG. 8 shows a simplified diagram illustrating a cell array of an IC according to some embodiments of the invention.

FIG. 8 shows a simplified diagram illustrating a cell array 500 of an IC according to some embodiments of the invention. The cell array 500 is a hybrid cell array formed by multiple logic cells 10 and multiple logic cells 30. In such embodiment, the logic cells 10 are arranged in the odd rows of the cell array 500 and the logic cells 30 are arranged in the even rows of the cell array 500.

In FIG. 8, the rows of the cell array 500 are divided into the groups G5 (labeled as G5_1 and G5_2), and the groups G5_1 and G5_2 have the same row configurations. Each of the groups G5_1 and G5_2 includes the rows ROW1 and ROW2. The logic cells 10 are arranged in the row ROW1, and the logic cells 30 are arranged in the row ROW2. It should be noted that the row number in the group G5 and the group number of group G5 in the cell array 500 are used as an example, and not to limit the invention. In such embodiment, the group G5 includes one row formed by the logic cells 10 and another row formed by the logic cells 30, and can be used as a unit to form the logic array 500. By repeatedly arranging the groups G5, the larger logic array 500 is obtained.

11 12

Figure 9:
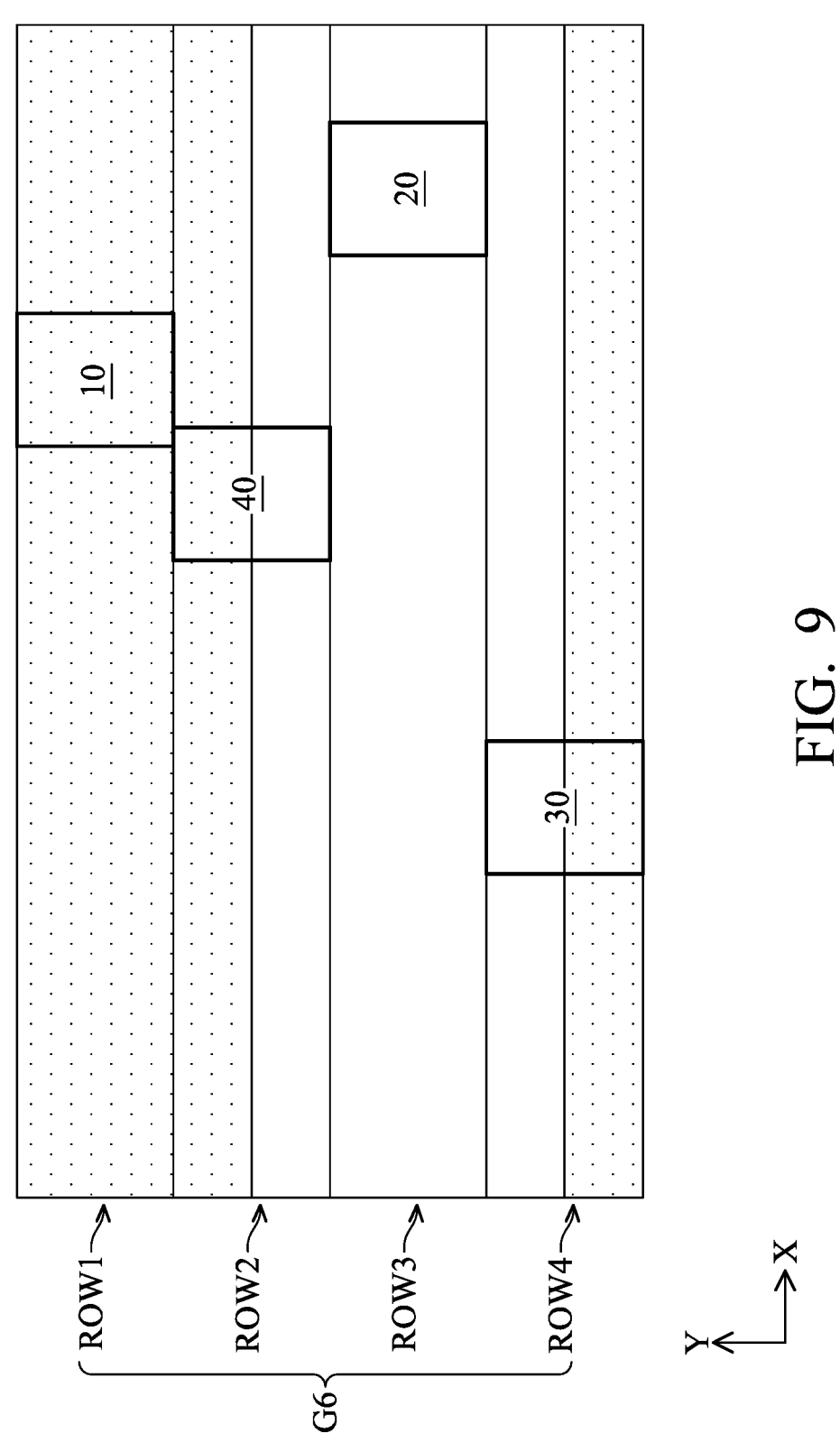
FIG. 9 shows a simplified diagram illustrating a cell array of an IC according to some embodiments of the invention.

FIG. 9 shows a simplified diagram illustrating a cell array 600 of an IC according to some embodiments of the invention. The cell array 600 is a hybrid cell array formed by multiple logic cells 10, 20, 30 and 40. In such embodiment, the cell array 600 includes the rows ROW1 through ROW4 that formed a group G6. In the group G6, the logic cells 10 are arranged in the row ROW1, the logic cells 40 are arranged in the row ROW2, the logic cells 20 are arranged in the row ROW3, and logic cells 30 are arranged in the row ROW4. The order of the rows is used as an example, and not to limit the disclosure.

In the cell array 600, the logic cells for power optimization are implemented by the logic cells 10 and are arranged in the row ROW1. The logic cells for speed optimization are implemented by the logic cells 20 and are arranged in the row ROW3. The logic cells with the P-type transistors for power optimization and the N-type transistors for speed optimization are implemented by the logic cells 40 and are arranged in the row ROW2. The logic cells with the P-type transistors for speed optimization and the N-type transistors for power optimization are implemented by the logic cells 30 and are arranged in the row ROW4. As described above, the group G6 can be used as a unit to form the logic array 600. By repeatedly arranging the groups G6, the larger logic array 600 is obtained.

Figure 10:
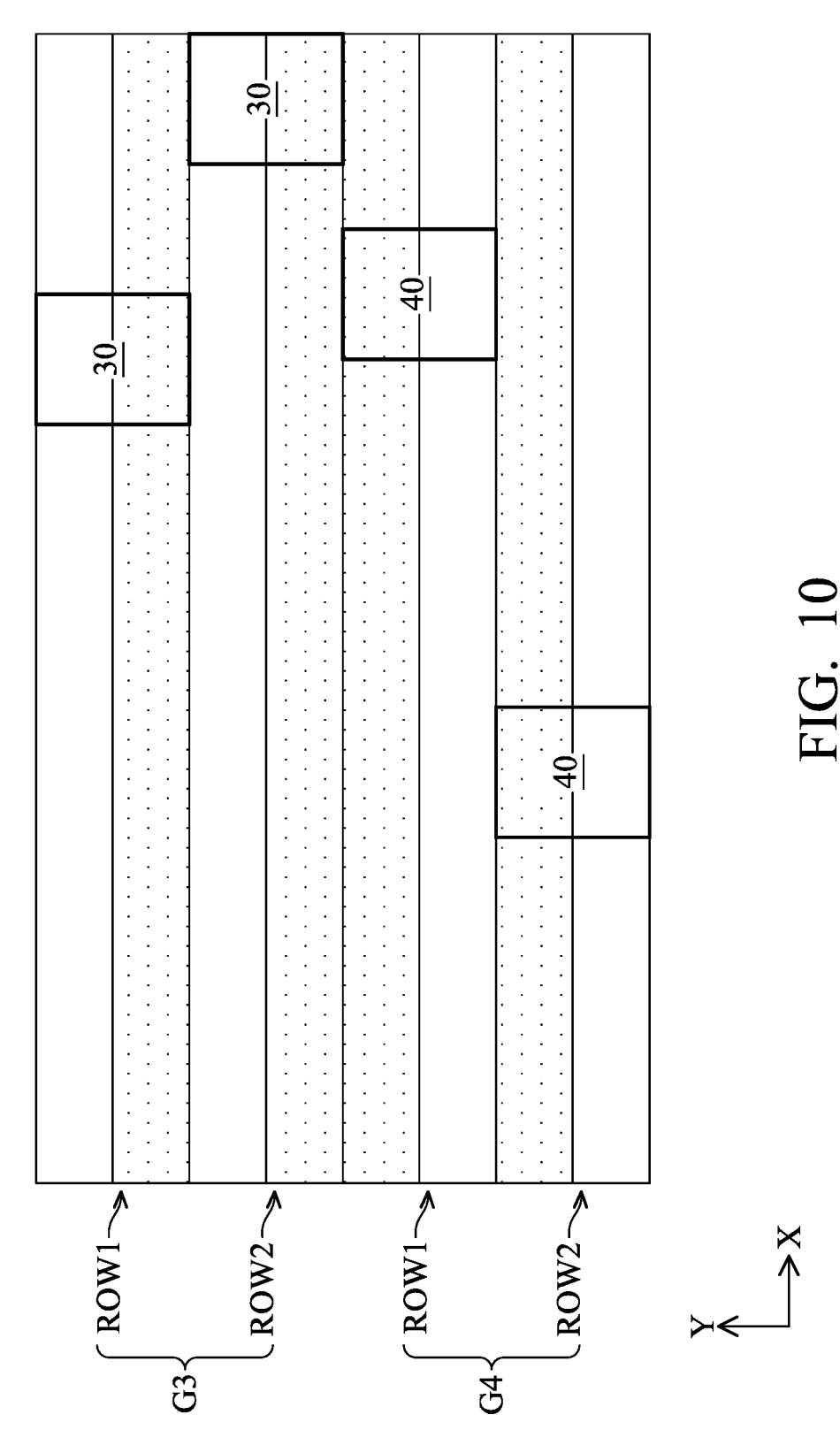
FIG. 10 shows a simplified diagram illustrating a cell array of an IC according to some embodiments of the invention.

FIG. 10 shows a simplified diagram illustrating a cell array 700 of an IC according to some embodiments of the invention. The cell array 700 is a hybrid cell array formed by a combined group that includes the group G3 of FIG. 6A and the group G4 of FIG. 7. In such embodiment, the row ROW2 of the group G3 is disposed to adjacent the row ROW1 of the group G4. Furthermore, by repeatedly arranging the combined group, the larger logic array 700 is obtained.

Figure 11:
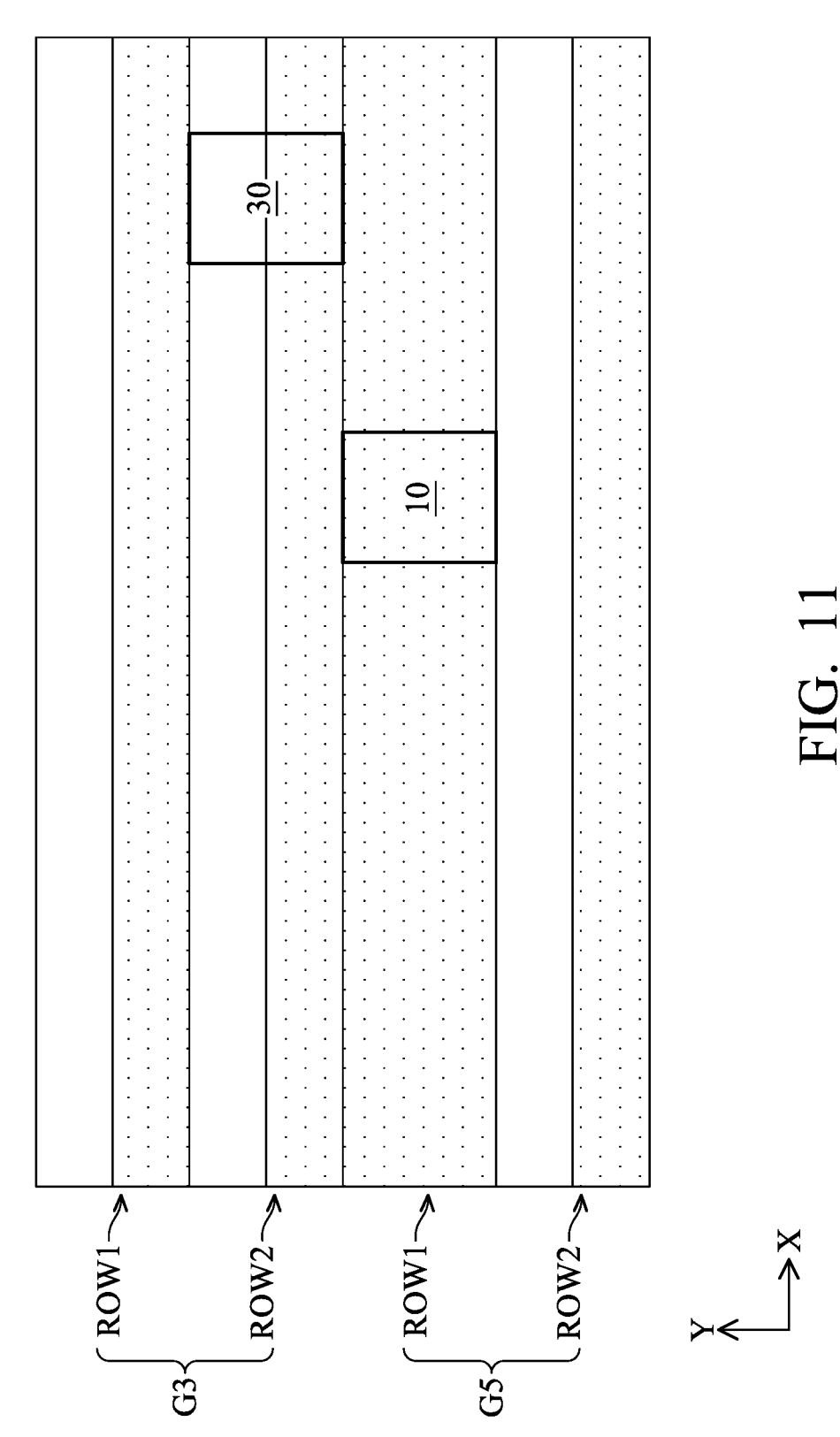
FIG. 11 shows a simplified diagram illustrating a cell array of an IC according to some embodiments of the invention.

FIG. 11 shows a simplified diagram illustrating a cell array 800 of an IC according to some embodiments of the invention. The cell array 800 is a hybrid cell array formed by a combined group that includes the group G3 of FIG. 6A and group G5 of FIG. 8. In such embodiment, the row ROW2 of the group G3 is disposed to adjacent the row ROW1 of the group G5. Furthermore, by repeatedly arranging the combined group, the larger logic array 800 is obtained.

In the embodiments, the semiconductor structures of cell array including multiple rows are provided. In some embodiments, the rows of the cell array may be divided into the same groups. In some embodiments, the group is a combined group formed by various groups. According to the embodiments, the logic cells (e.g., the logic cell 10, 20, 30 or 40) having the discontinuous active regions (e.g., the discontinuous active region 150 for the P-type transistor and the discontinuous active region 155 for the N-type transistor) and/or the continuous active regions (e.g., the continuous active region 160 for the P-type transistor and the continuous active region 165 for the N-type transistor) are provided. The logic cells for speed optimization or power optimization are arranged in the same row in the cell array. Thus, the cell array is capable of providing the effective operation for various applications.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a cell array having a plurality of rows, and comprising:
a plurality of first logic cells arranged in at least one first row, wherein the first logic cells share a first active region; and
a plurality of second logic cells arranged in at least one second row, wherein each of the second logic cells has a second active region, and the second active regions of two adjacent second logic cells are separated from each other by a first isolation structure,
wherein the first logic cells of the first row are in contact with the second logic cells of the second row;
wherein the first active region is a first continuous active region shared by first conductivity type transistors of the first logic cells, and the first conductivity type transistors of two adjacent first logic cells are separated from each other by a first dummy transistor;
wherein second conductivity type transistors of each of the first logic cells are formed in a discontinuous active region, and the discontinuous active regions of the two adjacent first logic cells are separated from each other by a second isolation structure;
wherein the second isolation structure is formed by performing a metal gate cutting process or a polysilicon cutting process on an extension of a gate structure of the first dummy transistor, and the second isolation structure extends above a top surface of the discontinuous active region.

2. The semiconductor structure as claimed in claim 1, wherein each of the second active regions is a first discontinuous active region, and first conductivity type transistors of each of the second logic cells are formed in respective first discontinuous active regions.

3. The semiconductor structure as claimed in claim 2, wherein second conductivity type transistors of each of the second logic cells are formed in a second discontinuous active region, and the second discontinuous active regions of the two adjacent second logic cells are separated from each other by the first isolation structure.

4. The semiconductor structure as claimed in claim 2, wherein second conductivity type transistors of the second logic cells share a continuous active region that is parallel to the first active region, and the second conductivity type transistors of the two adjacent second logic cells are separated from each other by a second dummy transistor.

5. The semiconductor structure as claimed in claim 1, wherein the first rows and the second rows have the same number, and the first and second rows are alternately arranged in the cell array.

6. The semiconductor structure as claimed in claim 1, wherein the number of the first rows is different from the number of the second rows in the cell array.

7. The semiconductor structure as claimed in claim 1, wherein in the second row, the number of the second logic cells is equal to the number of the second active regions.

8. A semiconductor structure, comprising:
a cell array having a plurality of rows, wherein the rows are divided into a plurality of groups, and each of the groups comprises:
a plurality of first logic cells arranged in a first row, wherein first conductivity type transistors of the first logic cells share a first continuous active region, and second conductivity type transistors of each of the first logic cells are formed in a first discontinuous active region; and a plurality of second logic cells arranged in a second row, wherein first conductivity type transistors of each of the second logic cells are formed in a second discontinuous active region, and second conductivity type transistors of the second logic cells share a second continuous active region, wherein in the second row, the second discontinuous active regions of two adjacent second logic cells are separated from each other by a first isolation structure;

wherein in the first row, the first discontinuous active regions of two adjacent first logic cells are separated from each other by a second isolation structure, and the first conductivity type transistors of the two adjacent first logic cells are separated from each other by a first dummy transistor;

wherein the second isolation structure is formed by performing a metal gate cutting process or a polysilicon cutting process on an extension of a gate structure of the first dummy transistor, and the second isolation structure extends above a top surface of the first discontinuous active region.

9. The semiconductor structure as claimed in claim 8, wherein in the second row, the second conductivity type transistors of the two adjacent second logic cells are separated from each other by a second dummy transistor.

10. The semiconductor structure as claimed in claim 8, wherein the second continuous active region is parallel to the first continuous active region.

11. The semiconductor structure as claimed in claim 8, wherein the first discontinuous active regions in the first row are surrounded by the first continuous active region in the first row and the second continuous active region in the second row, and the second continuous active region in the second row is surrounded by the first discontinuous active regions in the first row and the second discontinuous active regions in the second row.

12. The semiconductor structure as claimed in claim 8, wherein the first continuous active region in the first row is surrounded by the first discontinuous active regions in the first row and the second discontinuous active regions in the second row, and the second discontinuous active regions in the second row are surrounded by the first continuous active region in the first row and the second continuous active region in the second row.

13. The semiconductor structure as claimed in claim 8, wherein in the first row, the number of the first logic cells is equal to the number of the first discontinuous active regions.

14. The semiconductor structure as claimed in claim 8, wherein in the second row, the number of the second logic cells is equal to the number of the second discontinuous active regions.

15. The semiconductor structure as claimed in claim 8, wherein each of the groups further comprises:

a plurality of third logic cells arranged in a third row, wherein the third logic cells share a third continuous active region.

16. The semiconductor structure as claimed in claim 8, wherein each of the groups further comprises:

a plurality of fourth logic cells arranged in a fourth row, wherein each of the fourth logic cells has a third discontinuous active region, and the third discontinuous active regions of two adjacent fourth logic cells are separated from each other by a third isolation structure.

* * * * *